(12) United States Patent
Manz et al.

(10) Patent No.: US 7,030,491 B2
(45) Date of Patent: Apr. 18, 2006

(54) POWER SEMICONDUCTOR MODULE WITH DEFLECTION-RESISTANT BASE PLATE

(75) Inventors: Yvonne Manz, Weisendorf (DE); Jürgen Steger, Hipoltstein (DE); Harald Jäger, Eckental (DE); Herbert Rüger, Stammbach (DE); Jürgen Matthes, Schwarzbach/Wald (DE)

(73) Assignee: Semikron Electronik GmbH, Nürnberg (DE)

( * ) Notice: Subject to any disclaimer, the term of this patent is extended or adjusted under 35 U.S.C. 154(b) by 46 days.

(21) Appl. No.: 10/897,719

(22) Filed: Jul. 23, 2004

(65) Prior Publication Data

US 2005/0035445 A1 Feb. 17, 2005

(30) Foreign Application Priority Data

Jul. 23, 2003 (DE) .............................. 103 33 329

(51) Int. Cl.
*H01L 23/34* (2006.01)
(52) U.S. Cl. ..................... 257/728; 257/730
(58) Field of Classification Search ............ 257/728, 257/730, 776
See application file for complete search history.

(56) References Cited

U.S. PATENT DOCUMENTS 5,698,898 A * 12/1997 Matsumoto ............... 257/712
6,762,937 B1 * 7/2004 Kimoto et al. ............ 361/699

FOREIGN PATENT DOCUMENTS

DE 103 16 355 B3 7/2004

* cited by examiner

*Primary Examiner*—Phat X. Cao
(74) *Attorney, Agent, or Firm*—Cohen, Pontani, Lieberman & Pavane

(57) ABSTRACT

A power semiconductor module, having a metal base plate for mounting on a heat sink. The module comprises a framelike housing, a cover, terminal elements, leading to the outside of the housing, for load contacts and auxiliary contacts, and having at least one electrically insulating substrate, disposed inside the housing. The substrate includes an insulating body and a plurality of metal connecting tracks, electrically insulated from one another. Power semiconductor components are located on the connecting tracks and connected to these connecting tracks via appropriate circuitry. The base plate has a stiffening structure, which extends near and along a side of the base plate, and in the longitudinal direction of the base plate. The stiffening structure is formed of the base plate material itself by deformation and protrudes out of the upper surface of the base plate.

10 Claims, 3 Drawing Sheets

POWER SEMICONDUCTOR MODULE WITH DEFLECTION-RESISTANT BASE PLATE

BACKGROUND OF THE INVENTION

1. Field of the Invention

The invention is directed to a power semiconductor module, more particularly a power semiconductor module with a deflection resistant plate.

2. Description of the Related Art

Power semiconductor modules that are the point of departure for the present invention are known for instance from German Patent Disclosure DE 103 16 355. Such power semiconductor modules have a base plate for thermal coupling to a heat sink. For that purpose, it is of particular importance to assure that the base plate, after the power semiconductor module has been secured, be as completely in thermal contact with the heat sink as possible, for the sake of an efficient heat transfer. In modern power semiconductor modules particular emphasis is placed on having a compact structure. Therefore the proportion of the surface of the substrate occupied by the power semiconductor components is especially high. Accordingly, these power semiconductor modules have connecting devices for connection to the heat sink only in their corner regions. Power semiconductor modules with high power levels, in particular advantageously have a structural shape in which the length is substantially greater than the width. It is preferable for the substrate to have a further metallization on its side which faces the base plate. By means of this metallization, the substrates are bonded materially to the base plate. In the prior art, this connection is established by means of soldering.

In power semiconductor modules with a comparatively great length, a soldered connection of the substrates and base plate can cause concave sagging in the base plate. Concave sagging is understood here to mean sagging in which the sagging of the middle region of the base plate is in the direction of the power semiconductor module, while convex sagging means sagging in the direction of the heat sink. A convex sagging of the base plate is advantageous for an efficient heat transfer between the power semiconductor module and the heat sink, since then the base plate, after being secured to the heat sink, rests flatly on the heat sink. In the event of concave sagging, a plane contact would not be established. Even during production, the base plates in the prior art are thus manufactured with convex sagging. Despite this so-called prestressing of the base plate, soldering of the substrates can lead to concave sagging of the base plate, unless the base plate is sufficiently rigid. Adequate rigidity is attained in the prior art by designing the base plate as correspondingly thick.

On the other hand, economical, compact production of a power semiconductor module requires a base plate with the least possible thickness. In the prior art, power semiconductor modules, especially with a substantially greater length than width, thus either have the disadvantage of a thick base plate or the disadvantage of concave sagging of a thinner base plate.

SUMMARY OF THE INVENTION

The inventive module include a housing with a base plate and at least one electrically insulating substrate disposed therein. This substrate comprises an insulting body with a plurality of metal connecting tracks located thereon and insulated from one another, and power semiconductor components located on the connecting tracks and connected thereto by appropriate circuitry. Advantageously, the underside of the substrate has a two-dimensional metal layer, comparable to the connecting tracks. Such power semiconductor modules also have terminal elements for load contacts and auxiliary contacts.

It is therefore an object of the present invention to present a power semiconductor module in which the flexural strength thereof is increased in the longitudinal direction of the base plate, for a given thickness.

The fundamental concept of the invention is based on a power semiconductor module with a base plate for direct mounting on a heat sink, as in the prior art, comprising a framelike housing with at least one electrically insulating substrate disposed therein. This substrate in turn comprises an insulating body with a plurality of metal connecting tracks, located on its first main face and insulated from one another, as well as preferably a two-dimensional metal layer disposed on its second main face. A plurality of power semiconductor components are disposed on the connecting tracks of the first main face and electronically connected to the connecting tracks. The power semiconductor module also has terminal elements, leading to the outside thereof, for load contacts and auxiliary contacts.

The power semiconductor module of the invention has a base plate which has at least one stiffening structure in the longitudinal direction. This stiffening structure is formed by deforming a part of the base plate, so that it protrudes out of the plane of the base plate, parallel to the heat sink. At least one substrate, but preferably a plurality of individual substrates, are disposed on this base plate. Preferably, this involves a materially bonded connection, which in the prior art is embodied as a soldered connection.

An advantage of this embodiment of a power semiconductor module is that for a given thickness of the base plate, its rigidity in the longitudinal direction is increased substantially, and thus a convex sagging produced in production of the base plate exists even after the soldering of the substrates.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The invention is described in further detail below in terms of exemplary embodiments in conjunction with FIGS. 1 through 6.

DETAILED DESCRIPTION OF THE PRESENTLY PREFERRED EMBODIMENTS

Figure 1:
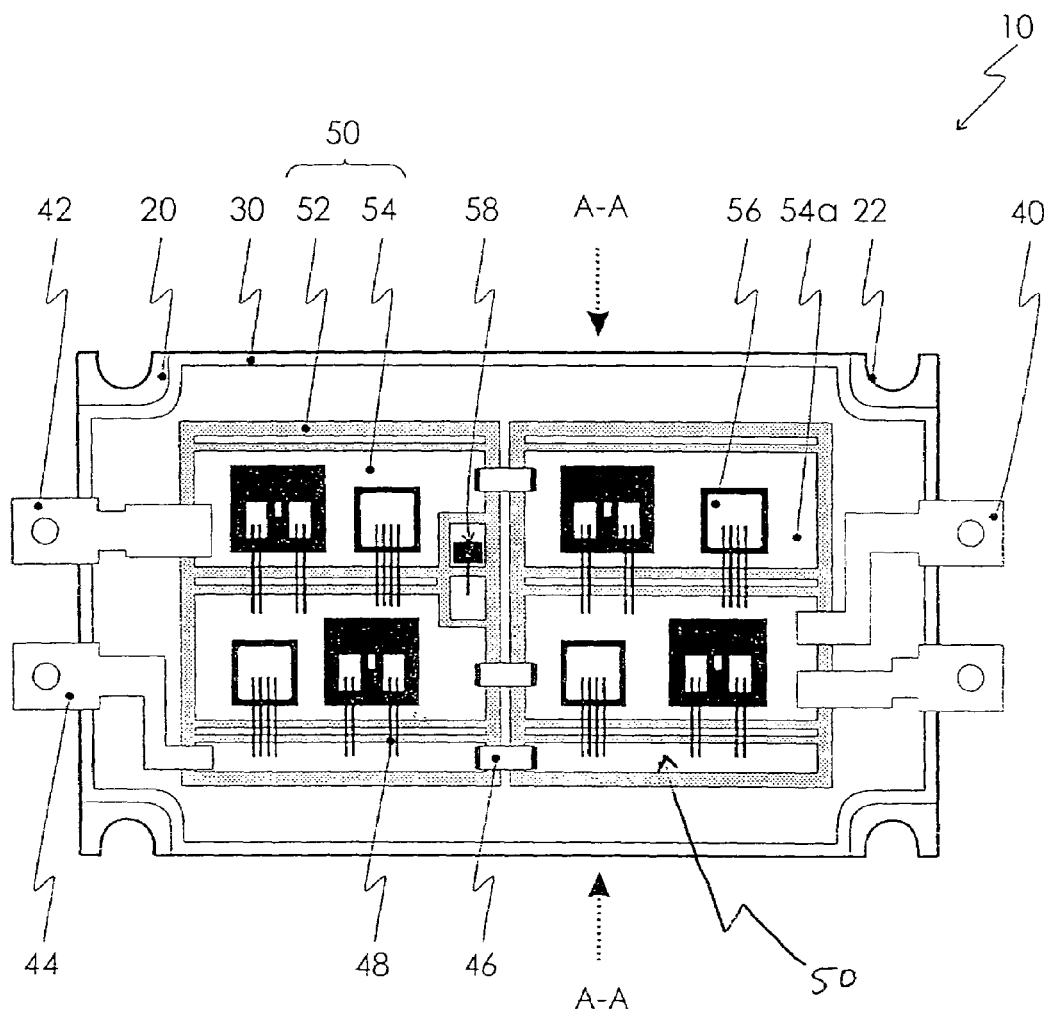
FIG. 1 shows a power semiconductor module of the prior art in plan view.

FIG. 1 shows a power semiconductor module of the prior art in plan view. A power semiconductor module 10 is shown, comprising a base plate 20, for mounting on a heat sink 80. For that purpose, base plate 20 has one recess 22 in the region of each of its corners. Module 10 further comprises a framelike housing 30 as well as two electrically insulating substrates 50. Each substrate 50 in turn comprises an insulating body 52, with a plurality of metal connecting tracks 54 insulated from one another and located on its first main face (shown in FIG. 1) remote from the base plate 20. On its second main face, facing toward the base plate 20, substrate 50 has a two-dimensional metallization 53 (FIG. 2) of the same type as connecting tracks 54 on the first main face. Power semiconductor components 56 are disposed on connecting tracks 54, and connected thereto by appropriate circuitry via wire bond connections 48. A sensor system component 58 is similarly situated on connecting tracks 54. Module 10 has terminal elements 40, 42, 44 for connecting to the load terminals (not shown). Connecting tracks 54 of substrates 50 are connected in part with one another by terminal elements 40 directly or by means of soldered bridges 46.

Figure 2:
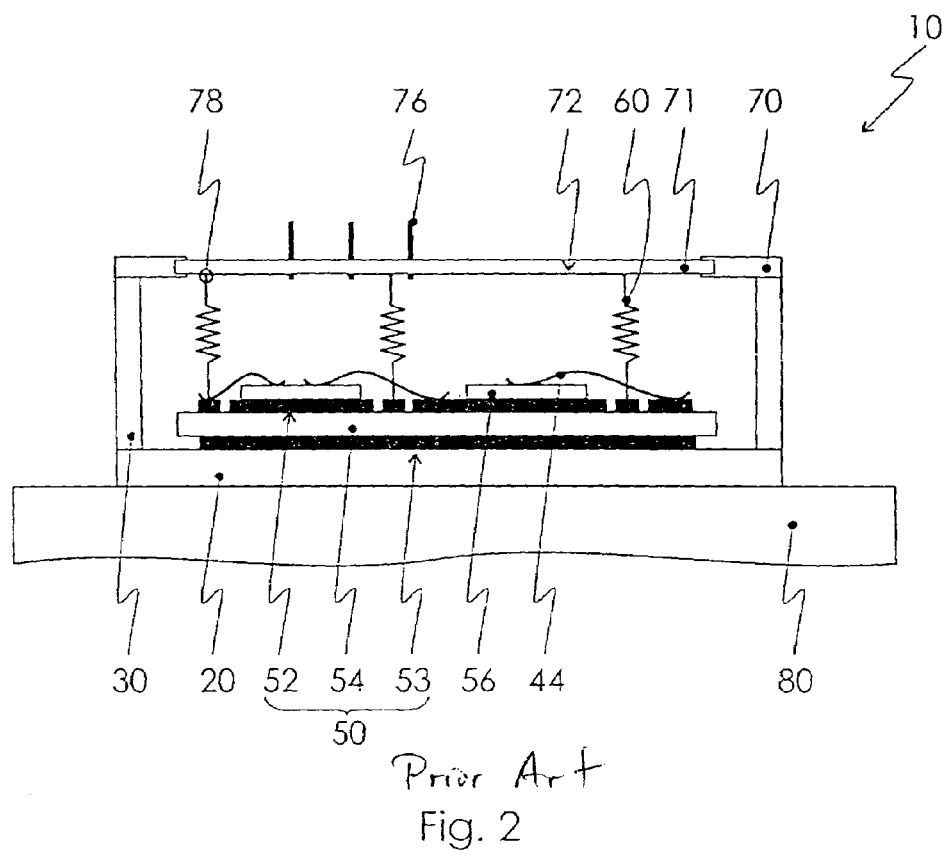
FIG. 2 shows a section taken along the line A—A through the power semiconductor module of FIG. 1 in a side view.
Figure 3:
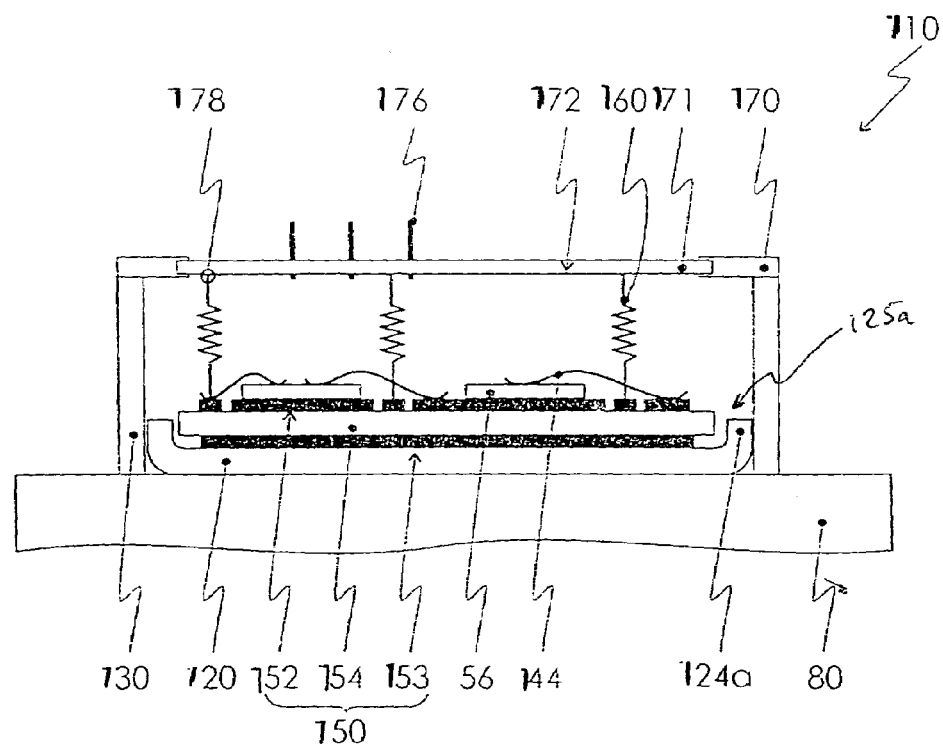
FIG. 3 shows a section through a power semiconductor module of the invention in a side view.
Figure 4:
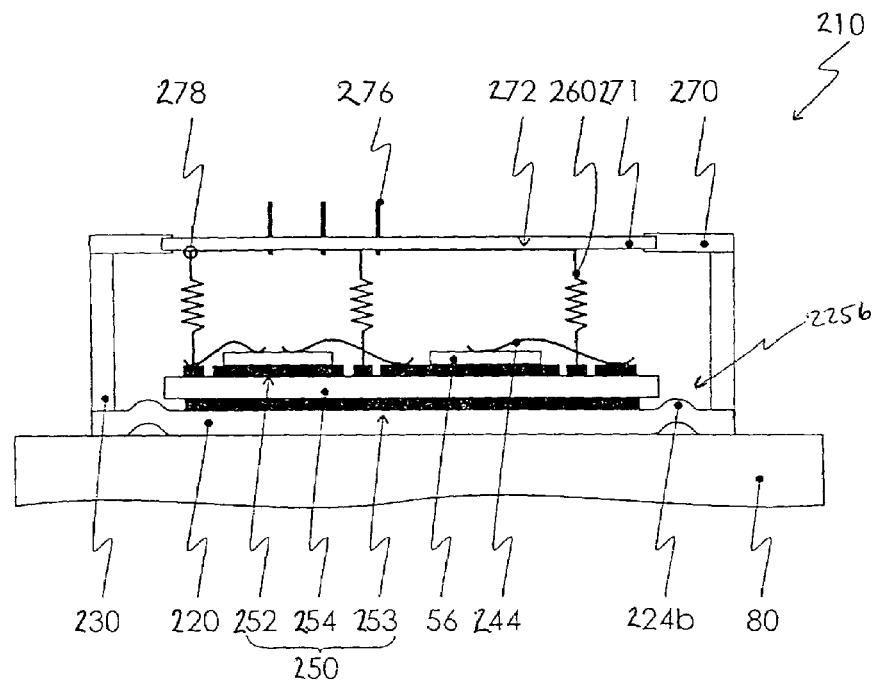
FIG. 4 shows a section through a further embodiment of a power semiconductor module of the invention in a side view.

FIGS. 2 through 4 show cross-sectional views through power semiconductor modules of the prior art (FIG. 2) and of the invention (FIGS. 3, 4), in each case in a section taken along the line A—A (in FIG. 1). In each Figure, a power semiconductor module 10, 110, 210 with a framelike housing 30, 130, 230 is shown in a side view. A so-called DCB (direct copper bonding) substrate 50, 150, 250 is disposed on base plate 20, 120, 220. Substrate 50, 150, 250 comprises an insulating body 52, 152, 252 for instance an aluminum oxide or aluminum nitride ceramic, with a two-dimensional layer 53, 153, 253 on its side facing the base plate 20, 120, 220, respectively, and a structured copper layer 54, 154, 254 on its side remote from base plate 20, 120, 220. This copper layer 54, 154, 254 represents the connecting tracks of the power semiconductor module. Components 56, 156, 256, as a rule power semiconductor components and sensor system components, are disposed on connecting tracks 54, 154, 254. The electrical connections are made by means of wire bond connections 44, 144, 244.

In addition, the auxiliary terminal elements of the respective power semiconductor module are shown. These are formed by contact springs 60, 160, 260 conductor tracks 72, 172, 272 disposed on a printed circuit board, and terminal pins 76, 176, 276.

A printed circuit board 71, 171, 271, on whose contact faces 78, 178, 278 contact springs 60, 10, 260 come to an end, is an integral component here of cover 70, 170, 270. Cover 70, 170, 270 itself is embodied in framelike form here and surrounds printed circuit board 71, 171, 271 on its edges without completely covering it.

FIG. 2 shows a section taken along the line A—A through the power semiconductor module 10 of the prior art in FIG. 1, in a side view. Base plate 20 comprises a plane copper plate, which has a convex prestressing in the longitudinal direction of approximately 2 mm, for a length of approximately 15 cm.

FIG. 3 shows a section through a power semiconductor module 120 of the invention, in a side view. The long sides of base plate 120 here are bent upward without interruption, each by approximately 90° in the direction of the module interior, that is, in the direction of the side of base plate 120 remote from the heat sink, via a portion 124a between the recesses 122 (FIG. 5) thereby forming a stiffening structure 125a. By means of this stiffening structure, a base plate 120 that is thinner by at least 20% compared to the prior art can be employed, with a simultaneous increase in the flexural strength of 60%. A convexly prestressed base plate maintains this convex prestressing even after the soldering thereto of the substrates. The prestressing here, as in the prior art, is approximately 2 mm.

FIG. 4 shows a section through a further embodiment of a power semiconductor module 210 of the invention, in a side view. Here a stiffening structure of the base plate 220 is realized by disposing a plurality of embossed regions 224b, extending in a plurality of portions, in the longitudinal direction along the long side of the power semiconductor module 210 thereby forming stiffening structure 225b. Embossed regions 224b are designed such that on the side toward heat sink 80, the material of base plate 220, as a rule copper, is pressed partially in the direction of the interior of module 210. The result is an upward bulge or curve on the side of the base plate 220 remote from heat sink 80. As a result, stiffening in the longitudinal direction of base plate 220 is attained near embossed regions 224b. The embossed regions 224b advantageously have a ratio of length to width of more than 4:1. It is furthermore advantageous if the individual embossed regions 224b overlap one another by more than 20%. Additionally, the base plate 220 has the above-described convex prestressing. Alternatively, it is understood that a single embossed region 224b may be provided, extending longitudinally over the entire length of base plate 20.

Figure 5:
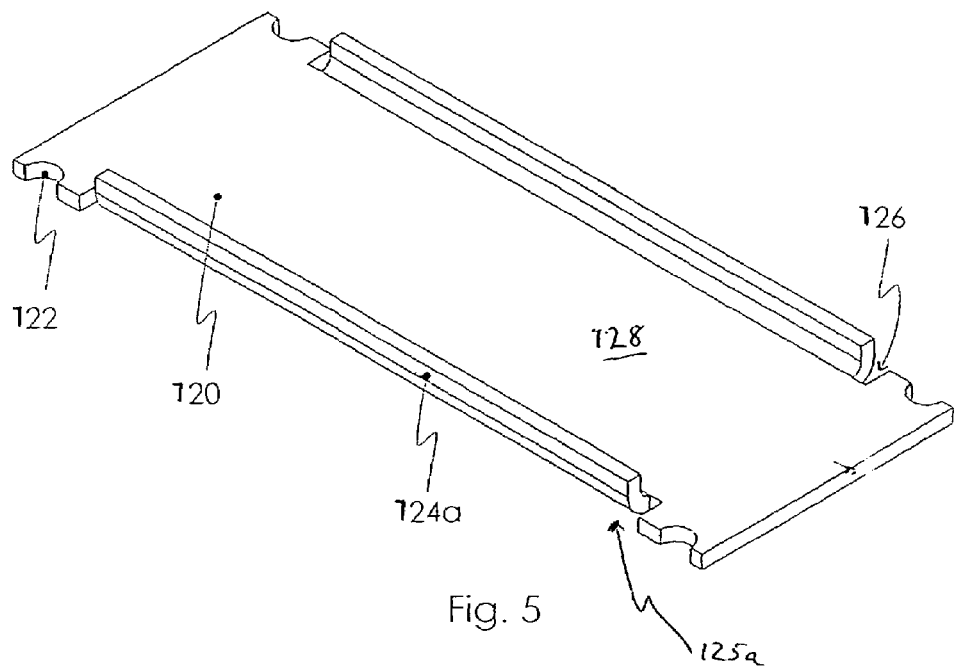
FIG. 5 shows a base plate of the power semiconductor module of the invention in a three-dimensional view.

FIG. 5 shows a base plate 120 of a power semiconductor module of the invention in a three-dimensional view. Here base plate 120 is shown, in which one portion 124a is cut free from base plate 120 by stamping on each long side by making recesses 126. Portion 124a is located between recesses 122, and is intended for the connection of power semiconductor module 110 to heat sink 80 by screws or other suitable means. Portion 124a extends along substantially the entire long side of base plate 120. Portion 124a is bent outward in the direction of substrate 150 (FIG. 3) from an upper surface of the 128 of base plate 120 itself. Base plate 120 is moreover prestressed convexly, as described above. This embodiment of base plate 120 of the power semiconductor module of the invention is effected by the known technique of stamping and bending.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module, having a metal base plate with an upper surface and defining a longitudinal direction, for mounting on a heat sink, said module comprising:
   a framelike housing;
   a cover for covering said module;
   terminal elements, leading to the outside of said housing, for load contacts and auxiliary contacts; and
   at least one electrically insulating substrate, disposed inside said housing, said substrate having an insulating body and a plurality of metal connecting tracks, electrically insulated from one another, located on a first main face of said substrate, remote from said base plate, power semiconductor components located on said connecting tracks and electrically connected to said connecting tracks, and at least one metal layer located on a second main face of the substrate, facing said toward said base plate, wherein said substrate is disposed on said base plate, and
   wherein said base plate has a stiffening structure, which extends along said longitudinal direction of said base plate, and said stiffening structure is formed of said base plate material itself by deformation, and protrudes out of said upper surface of said base plate.

2. The power semiconductor module of claim 1, wherein said base plate has long sides; and
   said stiffening structure comprises portions of said long sides of said base plate which are bent outward, in the direction of said substrate, from said upper surface of said base plate.

3. The power semiconductor module of claim 1, wherein said base plate has a plurality of recesses for connection of said power semiconductor module to said heat sink.

4. The power semiconductor module of claim 1, wherein said base plate is embodied as a stamped and bent part; and
   wherein said stiffening structure includes portions of said base plate which are cut free.

5. The power semiconductor module of claim 4, wherein said portions are cut free from said base plate by recesses formed between said portions and the reminder of said base plate.

6. The power semiconductor module of claim 1, wherein said base plate is materially joined to said metal layer of the substrate by a two-dimensional soldered connection.

7. The power semiconductor module of claim 1, wherein said stiffening structure extends over substantially an entire long side of said base plate.

8. The power semiconductor module of claim 1, wherein said stiffening structure includes portions which are disposed interruptedly and overlapping one another near at least one side of said base plate.

9. The power semiconductor module of claim 2, wherein said stiffening structure is disposed between and spread apart from recesses in said base plate for receiving screw connections.

10. The power semiconductor module of claim 2, wherein said stiffening structure is bent at substantially a right angle to said base plate in the direction away from said heat sink.

* * * * *